United States Patent
Suzuki et al.

(10) Patent No.: US 7,223,481 B2
(45) Date of Patent: *May 29, 2007

(54) METHOD OF PRODUCING ULTRA-THIN COPPER FOIL WITH CARRIER, ULTRA-THIN COPPER FOIL WITH CARRIER PRODUCED BY THE SAME, PRINTED CIRCUIT BOARD, MULTILAYER PRINTED CIRCUIT BOARD AND CHIP ON FILM CIRCUIT BOARD

(75) Inventors: Yuuji Suzuki, Tochigi (JP); Akira Matsuda, Tochigi (JP)

(73) Assignee: Furukawa Circuit Foil Co., Inc., Nikko (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/929,471

(22) Filed: Aug. 31, 2004

(65) Prior Publication Data

US 2005/0048306 A1     Mar. 3, 2005

(30) Foreign Application Priority Data

Sep. 1, 2003     (JP)  ............................. 2003-308820

(51) Int. Cl.
*B32B 15/00*  (2006.01)

(52) U.S. Cl. ...................... 428/612; 428/615; 428/618; 428/621; 428/656; 428/660

(58) Field of Classification Search ................ 428/615, 428/612, 352, 618, 621, 656, 660
See application file for complete search history.

(56) References Cited

U.S. PATENT DOCUMENTS

| | | | |
|---|---|---|---|
| 3,998,601 A * | 12/1976 | Yates et al. ................. | 428/607 |
| 5,066,366 A * | 11/1991 | Lin ............................. | 205/76 |
| 5,114,543 A * | 5/1992 | Kajiwara et al. ........... | 205/152 |
| 5,366,814 A * | 11/1994 | Yamanishi et al. ......... | 428/607 |
| 5,689,879 A * | 11/1997 | Urasaki et al. .............. | 29/846 |
| 6,183,880 B1 * | 2/2001 | Yoshioka et al. .......... | 428/607 |
| 6,270,889 B1 * | 8/2001 | Kataoka et al. ............ | 428/352 |
| 6,346,335 B1 * | 2/2002 | Chen et al. ................. | 428/629 |
| 6,924,043 B2 * | 8/2005 | Suzuki et al. .............. | 428/615 |

FOREIGN PATENT DOCUMENTS

JP     2000-269637 A     9/2000

* cited by examiner

*Primary Examiner*—Cathy F. Lam
(74) *Attorney, Agent, or Firm*—Birch, Stewart, Kolasch & Birch, LLP

(57) ABSTRACT

An object of the present invention is to produce an ultra-thin copper foil with a carrier which has few pinholes and small surface roughness and which has an the thickness of less than 5 μm, and to produce the method of producing the foil, and further to produce a printed circuit board for fine pattern, a multilayer printed circuit board and a chip on film circuit board by using the ultra-thin copper foil with a carrier. The present invention provides an ultra-thin copper foil with a carrier produced by stacking a peeling layer and an ultra thin copper foil in order on the surface of a carrier copper foil which is made smooth so that the mean surface roughness of at least one side is Rz of 0.01 to 2.0 μm by the chemical polishing, the electrochemical dissolution, or the smoothing plating processing method independently, combining two or more, or further combining the mechanical polishing.

21 Claims, 1 Drawing Sheet

METHOD OF PRODUCING ULTRA-THIN COPPER FOIL WITH CARRIER, ULTRA-THIN COPPER FOIL WITH CARRIER PRODUCED BY THE SAME, PRINTED CIRCUIT BOARD, MULTILAYER PRINTED CIRCUIT BOARD AND CHIP ON FILM CIRCUIT BOARD

BACKGROUND OF THE INVENTION

1. Field of the Invention

The present invention relates to a method of producing an ultra-thin copper foil with a carrier and an ultra-thin copper foil with a carrier produced by the same, in particular, to an ultra-thin copper foil with a carrier suitable for a printed circuit board for high density ultra-fine circuit applications (fine pattern), a multilayer printed circuit board and a chip on film circuit board.

2. Description of the Related Art

A printed circuit board is produced as follows.

First, a thin foil for forming a surface circuit is put on an electrically insulating board comprised of a glass-epoxy resin, a glass polyimide resin, etc., and then they are heated and pressed to produce a copper-cladding laminate board.

Next, this copper-cladding laminate board is successively formed with the through holes and plated at the through holes, then the copper foil at the surface of the copper-cladding laminate board is etched to form circuit patterns of the desired line widths and pitches of adjacent lines. Finally, a solder resist is formed and other finishing works are performed.

The copper foil used for the copper-cladding laminate board is roughened at the side to be hot-bonded to the base board, exhibits an anchoring effect on the boards by the roughened surface, to improve the peel strength between the base board and the copper foil to thereby ensure reliability on the printed circuit board. Further, recently, the roughened surface of the copper foil is covered with a resin for bonding such as an epoxy resin, and the copper foil with resin that this resin for bonding is made to an insulating resin layer in semi-cured state (B stage) is used as a copper foil for forming a surface circuit, then a printed circuit board, in particular a build up circuit board is produced by hot-bonding the side of the insulating resin layer to the substrate. A "build-up circuit board" is a type of a multilayer circuit board and a printed circuit board obtained by forming an insulating layer and circuit patterns one by one in turn on an insulating board, plating holes (via holes) formed by a laser method or photolithography, and stacking the circuit layers while connecting the layers conductively.

This circuit board can handle the increasingly higher densities of various electronic parts. By making the via holes increasingly small, the circuit patterns can also made higher in density. Therefore, there is a demand for a printed circuit board with circuit patterns enabling a circuit of fine line widths and pitches of adjacent lines, that is, fine patterns. For example, in the case of a printed a board having a high density ultra-fine circuit of line widths and pitches of adjacent lines of around 30 μm has been demanded.

If a thick copper foil as the copper foil for forming such a fine printed circuit board is used, the etching time until reaching the surface of the board becomes longer. As a result, the verticality of the sidewalls of the circuit patterns formed is ruined, and it may lead to disconnection when the circuit line width of the circuit pattern to be formed is narrow. Therefore, as the copper foil used for fine pattern applications, copper foil having a thickness of less than 9 μm is being required.

However, such a thin copper foil (hereinafter, it may be called an ultra-thin copper foil) has weak mechanical strength, is easily wrinkled and creased, and the foil sometimes goes out when producing a printed circuit board, so as an ultra-thin copper foil used for fine pattern applications, an ultra-thin copper foil layer on one surface of a carrier copper foil through a peeling layer is being used.

Now, an ultra-thin copper foil with a carrier which has the thickness of about 5 μm is mostly used, and furthermore it is required for a thinner foil.

By the way, as for a printed circuit board, density growth is progressing in the IC mounting board which drives the liquid crystal display which is a display part, such as a personal computer, a cellular phone, a plasma display unit, etc. The IC mounting board is also called as a chip on film (COF), since the IC is directly mounted on the board film.Spec pages at page 26

In COF mounting, the position of the IC is detected by the light passing through the film where a copper foil is etched away for forming circuit patterns. However, the visibility (capability of detecting The IC position by light) of the film that used a conventional ultra-thin copper foil with a carrier is not so good. The cause is that the surface roughness of an ultra-thin copper foil with a carrier is large. The film part through which light passes is a part that is removed by etching of the unnecessary part of a copper foil other than the circuit part formed by a copper foil. When the copper foil is bonded on the film, the unevenness of the surface of the copper foil is printed on the surface of the film, and then the unevenness of the surface of film enlarges. When light passes, because of the unevenness a quantity of light going straight ahead lessens. Therefore visibility gets bad. That is to say, it gets bad visibility that the roughness of the surface of the bonding copper is large.

An ultra-thin copper foil with a carrier is a thing that a peeling layer and an electroplated copper layer are formed in this order on the one side of a carrier foil. And the outermost surface of this electroplated copper layer is made as a roughened surface. Although the electroplated copper layer is used as the copper foil for a circuit baseboard, the condition of the surface roughness of the carrier foil has a very large impact on the number of pinholes of the electroplated copper layer or visibility in COF. Therefore, in a case of using an electrodeposited copper foil as a carrier foil, by using a shiny side that roughness is small (the side of an electrodepositing drum), historically the number of pinholes is decreased as much as possible and surface roughness is reduced (refer to Japanese unexamined patent publication No.2000-269637). However the control of the surface roughness has been performed by controlling the surface of the electrodepositing drum because roughness of the shiny side of the electrodeposited copper foil depends on surface roughness of the electrodepositing drum, there is a ceiling to control level, and administrative and maintenance expense increases to control it. Therefore it is expensive, the present condition is being unable to spend such expense in a usual product.

Moreover, when a rolled material is used as a carrier foil, because the surface roughness of a rolled material is smaller than an electrodeposited copper foil, a rolled material is more excellent in visibility than a case that an electrodeposited copper foil is used as a carrier foil. However, it was very difficult to produce a carrier foil that satiate user's specification, because the current cost of a rolled material is more expensive than an electrodeposited copper foil, and because it will be occur that rolling lines remain in the surface, etc.

Already mentioned, it resolved that the number of pinholes and the surface roughness (visibility of film) of an ultra-thin copper foil with a carrier depend on the surface roughness of the carrier foil, and the dependence become larger, as thickness of an ultra-thin copper foil is thinner. However, it is the present condition that the method of producing the ultra-thin copper foil with a carrier, without changing the current cost of production manufacturing, and using a carrier foil which has such a small surface roughness that satisfies user's way, is not developed.

SUMMARY OF THE INVENTION

In view of the above-mentioned circumstances, an object of the present invention is, in order to produce an ultra-thin copper foil with a carrier having few pinholes and small surface roughness as for an ultra-thin copper foil of 5 µm or less without changing the current cost of production manufacturing and produce a production satisfying user's way, to provide an ultra-thin copper foil with a carrier having few pinholes and small surface roughness and the producing method by using a carrier foil that is made smooth surface of a carrier foil which is an electrodeposited or a rolled copper or a copper alloy at the process such as the mechanical polishing, the chemical polishing, the electrochemical polishing, or the smoothing plating processing method independently, or combining two or more, and to produce a printed circuit board for fine pattern, a multilayer printed circuit board and a chip on film circuit board.

The present invention is a method of producing an ultra-thin copper foil with a carrier stacking a peeling layer and an ultra thin copper foil in order on the surface of a carrier copper foil which is made smooth so that the mean surface roughness of at least one side is Rz of 0.01 to 2.0 µm by the chemical polishing, the electrochemical dissolution, or the smoothing plating processing method independently, combining two or more, or further combining the mechanical polishing, and is an ultra-thin copper carrier foil produced by this method.

When the surface roughness of a carrier foil is more than 2.0 µm as Rz, the surface roughness of an ultra-thin copper foil also becomes more than 2.0 µm. For example, in the case that this ultra-thin copper foil is used for COF mounting, unevenness of the films is roughened because the surface unevenness of a copper foil is printed at forming a circuit pattern with an ultra-thin copper foil, as a consequence transmittance is nearly 0. Moreover, since a surface roughness of Rz of 0.01 µm or less is impractical because of being difficult to produce a foil stably from the view of technique and being expensive, it is preferable that the mean surface roughness is set to Rz of 0.01 to 2.0 µm.

The above peeling layer is formed by chromium, nickel, cobalt, iron, molybdenum, titanium, tungsten, phosphorus and/or these alloy layers, or these hydrated oxides, or by organic coating.

According to a first aspect of the present invention, there is provided a method of producing an ultra-thin copper foil with a carrier including the steps of performing an electrochemical polishing on a surface of a copper foil having the mean surface roughness Rz in a range of 0.01 to 10 µm at least on one side thereby the surface is made a smoothed surface having the mean surface roughness Rz of 0.01 to 2.0 µm to obtain the carrier of copper foil, and stacking a peeling layer and the ultra-thin copper foil on the smoothed surface of the carrier.

According to a second aspect of the present invention, there is provided a method of producing an ultra-thin copper foil with a carrier including the steps of polishing mechanically at least one surface of a copper foil thereby the surface is smoothed so as to have the mean surface roughness Rz in a range of 0.01 to 10 µm, performing an electrochemical polishing on the surface of the copper foil having the mean surface roughness Rz in the range of 0.01 to 10 µm thereby the surface is made a smoothed surface having the mean surface roughness Rz of 0.01 to 2.0 µm to obtain the carrier of the copper foil, and stacking a peeling layer and the ultra-thin copper foil on the smoothed surface of the carrier.

According to a third aspect of the present invention, there is provided a method of producing an ultra-thin copper foil with a carrier including the steps of polishing chemically a surface of a copper foil having the mean surface roughness Rz in a range of 0.01 to 10 µm at least on one side thereby the surface is made a smoothed surface having the mean surface roughness Rz of 0.01 to 2.0 µm to obtain the carrier of copper foil, and stacking a peeling layer and the ultra-thin copper foil on the smoothed surface of the carrier.

According to a fourth aspect of the present invention, there is provided a method of producing an ultra-thin copper foil with a carrier including the steps of polishing mechanically at least one surface of a copper foil thereby the surface is smoothed so as to have the mean surface roughness Rz in a range of 0.01 to 10 µm, polishing chemically the surface of the copper foil having the mean surface roughness Rz in the range of 0.01 to 10 µm thereby the surface is made a smoothed surface having the mean surface roughness Rz of 0.01 to 2.0 µm to obtain the carrier of the copper foil, and stacking a peeling layer and the ultra-thin copper foil on the smoothed surface of the carrier.

According to a fifth aspect of the present invention, there is provided a method of producing an ultra-thin copper foil with a carrier including the steps of performing a copper plating or a plating including nickel on a surface of a copper foil having the mean surface roughness Rz in a range of 0.01 to 10 µm at least on one side thereby the surface is made a smoothed surface having the mean surface roughness Rz of 0.01 to 2.0 µm to obtain the carrier of copper foil, and stacking a peeling layer and the ultra-thin copper foil on the smoothed surface of the carrier.

According to a sixth aspect of the present invention, there is provided a method of producing an ultra-thin copper foil with a carrier including the steps of polishing mechanically at least one surface of a copper foil thereby the surface is smoothed so as to have the mean surface roughness Rz in a range of 0.01 to 10 µm, performing a copper plating or a plating including nickel on the surface of the copper foil having the mean surface roughness Rz in the range of 0.01 to 10 µm thereby the surface is made a smoothed surface having the mean surface roughness Rz of 0.01 to 2.0 µm to obtain the carrier of the copper foil, and stacking a peeling layer and the ultra-thin copper foil on the smoothed surface of the carrier.

According to a seventh aspect of the present invention, there is provided a method of producing an ultra-thin copper foil with a carrier including the steps of polishing chemically at least one surface of a copper foil thereby the surface is smoothed so as to have the mean surface roughness Rz in a range of 0.01 to 10 µm, performing a copper plating or a plating including nickel on the surface of the copper foil having the mean surface roughness Rz in the range of 0.01 to 10 μm thereby the surface is made a smoothed surface having the mean surface roughness Rz of 0.01 to 2.0 μm to obtain the carrier of the copper foil, and stacking a peeling layer and the ultra-thin copper foil on the smoothed surface of the carrier.

According to a eighth aspect of the present invention, there is provided a method of producing an ultra-thin copper foil with a carrier including the steps of polishing mechanically and then polishing chemically at least one surface of a copper foil thereby the surface is smoothed so as to have the mean surface roughness Rz in a range of 0.01 to 10 μm, performing a copper plating or a plating including nickel on the surface of the copper foil having the mean surface roughness Rz in the range of 0.01 to 10 μm thereby the surface is made a smoothed surface having the mean surface roughness Rz of 0.01 to 2.0 μm to obtain the carrier of the copper foil, and stacking a peeling layer and the ultra-thin copper foil on the smoothed surface of the carrier.

According to a ninth aspect of the present invention, there is provided a method of producing an ultra-thin copper foil with a carrier including the steps of performing an electrochemical polishing on at least one surface of a copper foil thereby the surface is smoothed so as to have the mean surface roughness Rz in a range of 0.01 to 10 μm, performing a copper plating or a plating including nickel on the surface of the copper foil having the mean surface roughness Rz in the range of 0.01 to 10 μm thereby the surface is made a smoothed surface having the mean surface roughness Rz of 0.01 to 2.0 μm to obtain the carrier of the copper foil, and stacking a peeling layer and the ultra-thin copper foil on the smoothed surface of the carrier.

According to a tenth aspect of the present invention, there is provided a method of producing an ultra-thin copper foil with a carrier including the steps of polishing mechanically and then performing an electrochemical polishing on at least one surface of a copper foil thereby the surface is smoothed so as to have the mean surface roughness Rz in a range of 0.01 to 10 μm, performing a copper plating or a plating including nickel on the surface of the copper foil having the mean surface roughness Rz in the range of 0.01 to 10 μm thereby the surface is made a smoothed surface having the mean surface roughness Rz of 0.01 to 2.0 μm to obtain the carrier of the copper foil, and stacking a peeling layer and the ultra-thin copper foil on the smoothed surface of the carrier.

Further, the present invention provides a printed circuit board, a multilayer printed circuit board and a chip on film circuit board for fine pattern wherein high density ultra-fine circuits are formed with using the above ultra-thin copper foil with a carrier.

DESCRIPTION OF THE PREFERRED EMBODIMENTS

Figure 1:
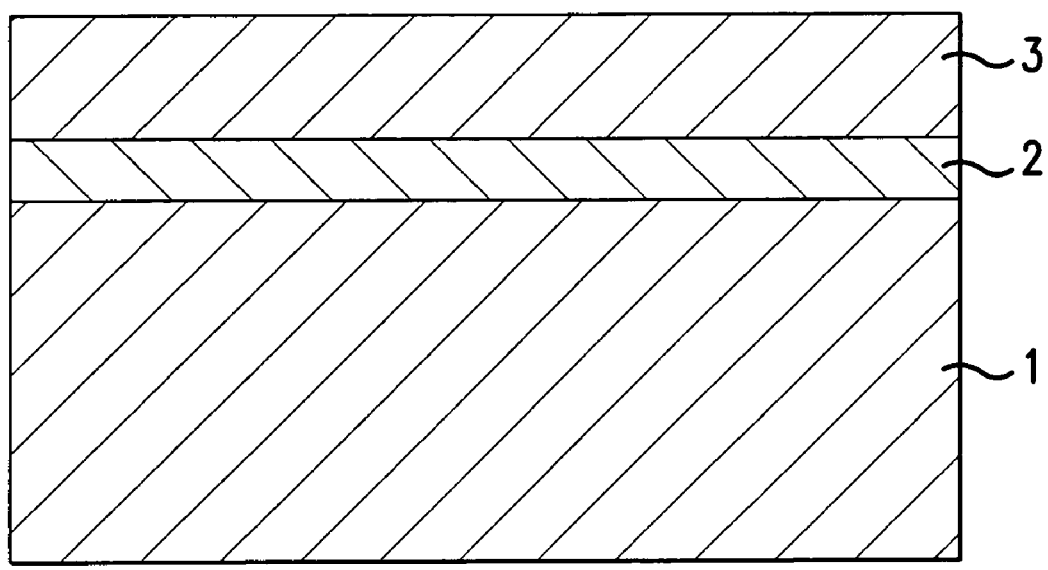
FIG. 1 illustrates an ultra-thin copper foil according to the present invention.

In the method of producing the ultra-thin copper foil with the carrier according to the present embodiment, at least one surface of the carrier copper foil is smoothed so that the mean surface roughness Rz of the surface becomes 0.01 to 2.0 μm by any one method of the chemical polishing, the electrochemical polishing, and the smoothing plating processing method, combining two methods or more among them, or furthermore combining the mechanical polishing, and a peeling layer and an ultra-thin copper foil are stacked in order on the surface of the smoothed carrier copper foil.

As the carrier foil, generally, an aluminum foil, an aluminum alloy foil, a stainless steel foil, a titanium foil, a titanium alloy foil, a copper foil, a copper alloy foil, etc. can be used, however, an electrodeposited copper foil, an electrodeposited copper alloy foil, a rolled copper foil, or a rolled copper alloy foil is preferable from the point of cost. And it is preferable to use a foil with a thickness of 7 to 200 μm.

As for the thickness of the carrier foil, a thin copper foil with a thickness of less than 7 μm is, since the mechanical strength of this copper foil is weak, easy to generate wrinkles and creases at the time of producing a printed circuit board etc., and it has a danger that a copper foil will go out, therefore it is difficult to play a role of a carrier foil. And it is not preferable that the thickness of a carrier foil becomes more than 200 μm, because increasing the weight per unit coil to a product (weight of a coil simple substance) influences the productivity greatly, and requires larger tension on the equipment, and the equipment becomes large scale. Therefore moderate thickness is 7 to 200 μm.

As for the surface roughness of the carrier foil, a copper foil which surface roughness of at least one side is Rz of 0.01 to 10 μm is adopted (although an aluminum foil, an aluminum alloy foil, a stainless steel foil, a titanium foil, s titanium alloy foil, etc. can be used, in the present invention, as mentioned above, a copper foil is adopted). In addition, a copper foil, the surface roughness Rz of which is 10 μm or more, can be made smooth by performing the mechanical polish in advance. Further, also in a copper foil, the surface roughness Rz of which is 10 μm or less, it is effective to make it smooth by performing the mechanical polishing, the chemical polishing, or the electrochemical polishing for the purpose of improving uniformity of roughness.

As disclosed in Japanese unexamined patent publication No.2000-269637, if the mean surface roughness Rz is less than 0.01 μm, there will be no necessity of making it smooth, and a peeling layer and an ultra-thin copper foil can be stacked immediately, but if the mean surface roughness Rz is more than 10 μm, very long processing time is needed for making it smooth by the chemical polishing, the electrochemical polishing or the smoothing plating, therefore the productivity is poor and it is impractical. Then, when making it smooth by the chemical polishing, the electrochemical dissolution, or the smoothing plating, in the present invention, it is preferable to perform a pretreatment by the mechanical polishing in advance until Rz becomes not more than 10 μm and to make smooth by the chemical polishing, the electrochemical polishing or the smoothing plating subsequently in order to shorten processing time and to improve productivity.

In particular, it is desirable that the surface roughness Rz of the carrier before smoothing process is in the range of 0.5 to 5.0 μm. When using an electrodeposited copper foil as the material foil of the carrier foil, in particular, since the variation in surface roughness is very large and the uniformity of processing may be lost, it is preferable to perform the mechanical polishing to give the uniformity. As for the final roughness of the mechanical polishing at this time, in consideration of the processing time of after treatment, it is preferable that Rz of a copper foil is 10 μm or less, and if possible, in the range from 0.5 to 5.0 μm.

When polishing the carrier foil chemically, it is preferable to use acids containing sulfuric acid, hydrochloric acid, phosphoric acid, nitric acid, etc., or alkalis containing cyanogen, sodium hydroxide, potassium hydroxide, pyrophosphoric acid, etc. as the processing solution. In order to shorten processing time, although it changes by the type of bath, it is preferable that a temperature of bath is 10 to 70° C. When the temperature of bath is 70° C. or more, evaporation of moisture is intense and it is not preferable to perform bath control, and a temperature is 10° C. or less, since the speed of the dissolution is slow, the productivity is poor.

It is desirable to stir the solution with a pump, an air compressor, a stirring machine, etc. as a method that shortens processing time. Moreover, it is also preferable that hydrogen peroxide and so on is put in an acid bath such as sulfuric acid bath in order to increase dissolution speeds.

When the surface of the carrier foil is dissolved electrochemically, the copper foil is immersed as an anode in an electrolytic bath, being filled with the processing solution. In the processing bath, a board that has conductivity (which is a cathode) is set to face the copper foil surface, which is going to be made smooth. As a quality of the material of the cathode, it is desirable to use platinum, titanium, SUS, etc. which is hard to dissolve in the acid or alkaline electrolytic solution. Moreover, as for processing solution, it is preferable to use acids containing sulfuric acid, hydrochloric acid, phosphoric acid, nitric acid, etc., or alkalis containing cyanogen, sodium hydroxide, potassium hydroxide, pyrophosphoric acid, etc.

In an electrolytic bath which dissolve a foil electrochemically, there is unevenness on the surface of the copper foil or the copper alloy foil which is an anode, the dissolution current tends to flow in the convex portions, the convex portions are dissolved preferentially, and are made smooth. Although the conditions of current density and processing time are changed by the surface state, the quality of the material, and the type of bath, as for the range of the current density, it is preferable to pass in the range of 1 to 100 $A/dm^2$. When the current density is 1 $A/dm^2$ or less there is not only no productivity, but there is no effect of smoothing because there is little difference in the current density that flows at uneven portion, while when the current density is 100 $A/dm^2$ or more, efficiency of the current density gets worse, and the effect corresponding to applying the high current cannot be got. In particular, in order to get smoothness, taking the current efficiency into consideration and shortening the processing time slightly in high current density is preferable to make it smooth, because the difference of the current that flows to convexity and concavity becomes large. Because of the above, it is effective to use the pulse electric current and so on.

Except for the above method that is the chemical polishing or the electrochemical polishing, there is a method that is depositing metals for improving smoothness. This is the method that a smoothing plating film with a copper sulfate plating bath, a copper cyanide plating bath, a cupric fluoborate plating bath, a copper pyrophosphate plating bath and a copper sulfamate plating bath is formed on the uneven surface of the foil which is produced by the above mentioned electrodeposition or rolling in the plating conditions which enable to form a plating film with smoothness. In order to form a plating film with smoothness, the method wherein unevenness of the surface is removed using an alkaline or an acid plating bath including the additive can also be used. As a plating bath containing the additive which makes the surface of the copper foil smooth, the plating bath which is introduced generally by reference as the brightening plating bath or which is commercially available (for example, the plating bath which is added a brightening agent to a copper sulfate plating bath, a copper pyrophosphate plating bath, a copper cyanide plating bath, a copper sulfamate plating bath, etc.) can be used, and a plating bath known by a brightening plating bath can be used wherein the metal to be plated is silver, tin, nickel, zinc etc. Each constituent composition, concentration, temperature, and quantity of the additive of the plating bath is various by each type of bath, but it is preferable that the plating solution can be used in the current density of 0.1 $A/dm^2$ or more.

Moreover, although the amount of the deposited metal changes by the material foil and the target surface roughness, it needs to deposit 0.01 μm or more in the thickness of plating. Because, when the amount of deposition is 0.01 μm or less, the target effect does not appear. It is confirmed by observing a cross section of a copper foil deposited with metal as the material foil plated with two layers including crystal grains having different size and shape from each other. And, in order to make surface roughness small, it is preferable that the size of the crystal grain plated on the surface is 20 μm or less. Moreover, the mean surface roughness of the copper foil on which polishing, dissolution or/and plating by the above-mentioned method is performed is Rz of 0.1 to 2.0 μm, and for visibility and using as fine patterns especially it is preferable that the mean surface roughness of the copper foil is Rz of about 0.1 to 1.0 μm.

It is preferable that the peeling layer prepared on carrier foil with the smoothed surface is the layer that consists of chromium, nickel, cobalt, iron, molybdenum, titanium, tungsten, phosphorus or/and layers of alloys thereof, or layers of hydrated oxides thereof, or an organic coating. As the chromium alloy, nickel-chromium, cobalt-chromium, chromium-tungsten, chromium-copper, chromium-iron, chromium-titanium may be mentioned. As the ternary alloy plating, nickel-iron-chromium, nickel-chromium-molybdenum, nickel-chromium-tungsten, nickel-chromium-copper, nickel-chromium-phosphorus, cobalt-iron-chromium, cobalt-chromium-molybdenum, cobalt-chromium-tungsten, cobalt-chromium-copper, cobalt-chromium-phosphorus, etc. may be mentioned.

Moreover, as for an organic coating benzotriazole etc. is preferable.

It is preferable that the metals and the hydrated oxides, which form these peeling layers, are formed by the electroplating. In addition, for attaining stabilization of the peelability after heat-pressing the ultra-thin copper foil with the carrier to an insulation base material, it is preferable to use nickel and iron, or layers of alloys thereof as the ground of a peeling layer. The peel strength at the time of peeling the carrier foil is influenced with the amount of deposition of these metals. That is, if an peeling layer is thick (that is, if there is the large amount of deposition of plated metal), the surface of the carrier foil is covered with the metal constituting the peeling material (hereinafter called as peeling material metal) completely, it is considered that the peel strength corresponds to the peeling power which tears off the joint surfaces between the surface of the peeling material metal and the ultra-thin copper foil stacked afterward. On the other hand, when a peeling layer is thin (that is, if there is the small amount of deposition of plated metal), the surface of the carrier foil is not completely covered with the peeling material metal, it is thought that the peel strength is the peeling power which tears off the joint surfaces between the carrier foil which is exposed slightly and the peeling material metal and the ultra-thin copper foil deposited on them. Therefore, although the peel strength of the carrier foil and the ultra-thin copper foil changes with the amount of deposition of plated metal which forms a peeling layer, if a peeling layer is formed (deposited) to some extent thickly, the peel strength will not change any more. According to the experiment, as the amount of deposition of the metal, which forms a peeling layer, even if the amount of deposition of is made 100 mg/dm$^2$ or more, the result that the peel strength does not change is obtained.

Although forming a peeling layer only with a peeling material metal makes easy the high temperature peeling with the carrier foil and the ultra-thin copper foil, further if a hydrated oxide exists in the metal surface, it will become possible to improve peelability.

Moreover, when using an organic coating for a peeling layer, as an organic coating, it is preferable to use BTA (benzotriazole), silane, etc. that are generally marketed as a copper rust prevention. It is preferable that the thickness of the organic coating is 0.1 to 100 nm. Because when the thickness of the organic coating is less than 0.1 nm, it does not play a part of a peeling layer, and when it becomes more than 100 nm, the copper plating layer (the ultra-thin copper film) formed on the peeling layer is not formed well.

On the peeling layer, the ultra-thin copper foil is formed by using a copper sulfate plating bath, a copper cyanide plating bath, a cupric fluoborate plating bath, a copper pyrophosphate plating bath, a copper sulfamate plating bath, etc.

At this time, if a hydrated oxide exists on the surface of the peeling layer, the ultra-thin copper foil forming conditions (dip time in the plating bath, current value, out of plating bath, condition of water washing, pH concentration just behind plating the peeling layer, etc.) is closely related to the hydrated oxide existing on the surface, and the residual state of this hydrated oxide is considered to influence the high temperature peelability greatly. It is especially preferable that the plating bath of pH from 3 to 12 may be used for plating the ultra-thin copper foil, in order to make the peeling layer stable. It can plate without impairing the peelability of the peeling layer, and the peelability also increases stability more by using this plating bath. However, because of the peelability, the uniform plating is very difficult for the plating of the ultra-thin copper foil on the peeling layer, and the number of pinholes of the ultra-thin copper foil layer increases. As this measures, it is preferable to perform a copper strike-plating. Uniform plating will be performed on the peeling layer by performing a copper strike-plating, and the number of pinholes on the ultra-thin copper foil decreases remarkably.

Although it is preferable that the thickness of the copper plating in a copper strike-plating is 0.001 to 1 μm and various conditions exist by the type of bath, it is preferable that the current density is 0.1 to 20 A/dm$^2$, the plating time is 0.1 to 300 seconds. Because when the current density is 0.1 A/dm$^2$ or less, it is difficult to plate uniformly on a peeling layer, and when the current density is 20 A/dm$^2$ or more, burnt plating occurs in a copper strike-plating that the metal concentration of the plating solution is thinned, hence the uniform ultra-thin copper foil cannot be obtained. Moreover, as for the plating time, in 0.1 seconds or less it is too short to obtain sufficient plating layer, and in 300 seconds or more, productivity is poor, and it is not preferable that the equipments are expensive considering the length of a processing line. In order not to impair a peelability of a peeling layer, a copper strike-plating is to plate a copper plating layer of 0.001 μm or more in pyrophosphate copper plating bath, after that a copper plating is performed in a copper sulfate plating bath, a cupric fluoborate plating bath, and a copper pyrophosphate plating bath, a copper sulfamate plating bath and a copper cyanide plating bath, and an ultra-thin copper foil is made.

In addition, a copper cyanide plating can also be used as a copper strike-plating bath.

Moreover, in order to obtain the peel strength between resin and the surface of the ultra-thin copper foil, it is preferable to roughen the ultra-thin copper foil surface, and to set the mean roughness Rz of 0.2 to 3.0 μm of the roughened surface. In the surface roughness of 0.2 μm or less roughening is almost meaningless because roughening seldom affects adhesion, and when it has the roughness of 3 μm or more, since it can obtain sufficient deposition, it is thought that more roughening is unnecessary.

The present invention can perform a high density ultra-fine circuit to a board by using the above-mentioned ultra-thin copper foil with the carrier for manufacturing a printed circuit board for fine pattern, a multilayer printed circuit board, a chip on film circuit board. Moreover, since visibility is improved, the efficiency of manufacture of electric devices, such as IC, can be increased.

By the method of producing the ultra-thin copper foil with a carrier in this invention, a product having few pinholes and good visibility can be offered by making the surface of carrier foil smooth in advance.

Moreover, the present invention has outstanding effects. For example, although the number of pinholes and visibility of the ultra-thin copper foil is influenced by the carrier foil surface roughness of the copper foil with the carrier conventionally, the ultra-thin copper foil with the carrier having few pinholes and good visibility is produced by making the surface of the carrier foil smooth. And user's needs are satisfied. Further the producing costs can be provided at a price which does not change with the former because a copper (alloy) foil of the usual product can be used, and so on.

FIG. 1 illustrates an ultra-thin copper foil according to the present invention. As shown, the ultra-thin copper foil includes a copper carrier foil 1 having at least one surface with a final mean surface roughness Rz of 0.01 to 2.0 μm, a peeling layer 2 stacked on the copper carrier foil 1, and an ultra-thin copper foil layer 3 stacked on the peeling layer 2.

EXAMPLES

Hereinafter, the present invention will be explained in detail in accordance to examples.

Example 1

1. Smoothing of Carrier Foil

An electrodeposited copper foil having a surface roughness Rz of 2.1 μm and a thickness of 35 μm was made into an anode and in an electrolytic solution of the sulfuric concentration of 50 g/l, passing the current having the current density of 25 A/dm$^2$ for 20 seconds made the surface smooth by dissolving, and the smoothed surface having Rz of 0.65 μm was obtained. The electrodeposited copper foil having this smoothed surface was made as a carrier copper foil.

2. Formation of Peeling Layer

Electroplating of chromium was continuously performed on the smoothed surface of a carrier copper foil being made smooth, and the chromium plating peeling layer of the amount of deposition of 0.50 mg/dm$^2$ was formed. In this surface layer the hydrated oxide film was formed.

3. Formation of Ultra-Thin Copper Foil

Next, on this chromium plating peeling layer the ultra-thin copper foil was plated by using the following plating bath in the electric current density 5 A/dm², and formed the ultra-thin copper foil of the thickness of 3 μm as an ultra-thin copper foil with a carrier.

| | |
|---|---|
| Cu$_2$P$_2$O$_7$·3H$_2$O: | 85 g/l |
| K$_4$P$_2$O$_7$: | 350 g/l |
| NH$_4$OH (28%): | 5 ml/l |
| pH: | 8.5 |
| temperature of bath: | 50° C. |

Further, roughening process that copper particles were deposited was performed. As rust-prevention and surface treatment, the roughened ultra-thin copper layer was plated by zinc and treated by chromate, and then after immersed in solution of vinyltris (2-methoxyethoxy) silane of concentration of 2.0 g/l for 5 seconds, taken out and dried by warm air with a temperature of 100° C. to obtain an ultra-thin copper foil with a carrier.

Example 2

1. Smoothing of Carrier Foil

After performing the mechanical polishing of the copper foil having Rz of 1.7 μm and the thickness of 55 μm and smoothing the mean surface roughness of Rz to 1.2 μm, this foil was made into an anode, in the electrolytic solution of the pyrophosphoric acid of concentration of 100 g/l, passing the current having the current density of 22 A/dm² for 50 seconds made the surface smooth by dissolving, and the smoothed surface copper foil (carrier copper foil) having Rz of 0.55 μm was obtained.

2. Formation of Peeling Layer

Electroplating of chromium was continuously performed on the smoothed surface of a carrier copper foil being made smooth, and the chromium plating peeling layer of the amount of deposition of 0.50 mg/dm² was formed. In this surface layer the hydrated oxide film was formed.

3. Formation of Ultra-Thin Copper Foil

On this chromium plating peeling layer, a copper strike-plating was performed for 30 seconds under the following conditions.

| | |
|---|---|
| Cu$_2$P$_2$O$_7$·3H$_2$O: | 30 g/l |
| K$_4$P$_2$O$_7$: | 300 g/l |
| PH: | 8 |
| current density: | 1.5 A/dm² |

Then, the electroplating was performed to be the thickness of 3 μm of the ultra-thin copper foil under the following conditions.

| | |
|---|---|
| Cu$_2$P$_2$O$_7$·3H$_2$O: | 85 g/l |
| K$_4$P$_2$O$_7$: | 350 g/l |
| NH$_4$OH (28%): | 5 ml/l |
| pH: | 8.5 |
| current density: | 4 A/dm² |

Next, roughening which copper particles were deposited was performed. As rust-prevention and surface treatment, the roughened ultra-thin copper foil was plated by zinc and treated by chromate to obtain an ultra-thin copper foil with a carrier.

Example 3

1. Smoothing of Carrier Foil

Electrodeposited copper foil having Rz of 1.5 μm and the thickness of 35 μm was made immersed for 120 seconds in the solution containing sulfuric acid of the concentration of 100 g/l and hydrogen peroxide solution of 5%, it made smooth, and the smoothed surface of Rz of 1.2 μm was obtained. An electrodeposited copper foil having this smoothed surface was made as a carrier copper foil.

2. Formation of Peeling Layer

Electroplating of nickel-molybdenum was continuously performed on the smoothed surface of a carrier copper foil being made smooth, and nickel-molybdenum plating layer of the deposited amount 0.3 mg/dm² was formed.

3. Formation of Ultra-Thin Copper Foil

Next, on the nickel-molybdenum peeling layer, an ultra-thin copper foil with a carrier was plated by using the following plating bath in the electric current density 5 A/dm², and the ultra-thin copper foil was to be the thickness of 5 μm.

| | |
|---|---|
| Cu$_2$P$_2$O$_7$·3H$_2$O: | 85 g/l |
| K$_4$P$_2$O$_7$: | 350 g/l |
| NH$_4$OH (28%): | 5 ml/l |
| pH: | 8.5 |
| temperature of bath: | 50° C. |

Further, roughening which copper particles were deposited was performed. As rust-prevention and surface treatment, the roughened ultra-thin copper foil was plated by zinc and treated by chromate to obtain an ultra-thin copper foil with a carrier.

Example 4

1. Smoothing of Carrier Foil

After performing the mechanical polishing of the copper foil having Rz of 1.7 μm and the thickness of 55 μm and smoothing the mean surface roughness Rz to 1.2 μm, this foil was immersed in the solution containing hydrochloric acid of 60 g/l with a temperature of 50° C., and made the surface smooth by dissolving, then the smoothed surface copper foil (carrier copper foil) having Rz of 1.0 μm was obtained.

2. Formation of Peeling Layer

Electroplating of chromium was continuously performed on the smoothed surface of a carrier copper foil being made smooth, and the chromium plating peeling layer of the amount of deposition of 0.50 mg/dm² was formed. In this surface layer the hydrated oxide film was formed.

3. Formation of Ultra-Thin Copper Foil

On this chromium plating peeling layer, a copper strike-plating was performed for 30 seconds under the following conditions.

| | |
|---|---|
| Cu$_2$P$_2$O$_7$·3H$_2$O: | 30 g/l |
| K$_4$P$_2$O$_7$: | 300 g/l |
| pH: | 8 |
| current density: | 1.5 A/dm² |

Then, the ultra-thin copper foil was electroplated to be the thickness of 3 μm under the following conditions.

| | |
|---|---|
| $Cu_2P_2O_7 \cdot 3H_2O$: | 85 g/l |
| $K_4P_2O_7$: | 350 g/l |
| $NH_4OH$ (28%): | 5 ml/l |
| pH: | 8.5 |
| current density: | 4 A/dm$^2$ |

Next, roughening which copper particles were deposited was performed. As rust-prevention and surface treatment, the roughened ultra-thin copper foil was plated by zinc and treated by chromate to obtain an ultra-thin copper foil with a carrier.

Example 5

1. Smoothing of Carrier Foil

An electrodeposited copper foil of Rz of 1.9 μm with thickness of 30 μm was made into the cathode, using brightening copper plating bath which contains copper concentration of 50 g/l, sulfuric acid concentration of 100 g/l and add the small amount of additive, and passing the current having the current density of 5 A/dm$^2$ for 1.5 minutes, the foil was plated for filling surface concavities and made smoothed to Rz of 0.5 μm.

2. Formation of Peeling Layer

Electroplating of nickel-cobalt was performed on the smoothed surface of a carrier copper foil being made smooth and nickel-cobalt peeling layer of the amount of deposition of 1.0 mg/dm$^2$ was formed and the ultra-surface layer was oxidized.

3. Formation of Ultra-Thin Copper Foil

Next, on this nickel-cobalt layer, a copper strike-plating was performed for 60 seconds under the following conditions.

| | |
|---|---|
| $Cu_2P_2O_7 \cdot 3H_2O$: | 30 g/l |
| $K_4P_2O_7$: | 300 g/l |
| pH: | 8 |
| current density: | 1.5 A/dm$^2$ |

Then, the ultra-thin copper foil was electroplated to be the thickness of 3 μm under the following conditions.

| | |
|---|---|
| $Cu_2P_2O_7 \cdot 3H_2O$: | 85 g/l |
| $K_4P_2O_7$: | 350 g/l |
| $NH_4OH$ (28%): | 5 ml/l |
| pH: | 8.5 |
| current density: | 4 A/dm$^2$ |

Next, roughening which copper particles were deposited was performed. As rust-prevention and surface treatment, the roughened ultra-thin copper foil was plated by zinc and treated by chromate to obtain an ultra-thin copper foil with a carrier.

Example 6

1. Smoothing of Carrier Foil

After performing the mechanical polishing of the copper foil having Rz of 10 μm and the thickness of 35 μm, smoothing the mean surface having the roughness Rz of 1.3 μm, using a brightening copper plating bath which contained copper cyanide of 65 g/l, free sodium cyanide of 25 g/l and added the small amount of additive, passing the current having the current density of 34 A/dm$^2$ for 3 minutes, the foil was plated for filling surface concavities to make smooth to Rz of 0.45 μm.

2. Formation of Peeling Layer

Electroplating of chromium was continuously performed on the smoothed surface of the carrier copper foil being made smooth, and the chromium plating peeling layer of the amount of deposition of 0.50 mg/dm$^2$ was formed. In this surface layer the hydrated oxide film was formed.

3. Formation of Ultra-Thin Copper Foil

On this chromium plating peeling layer, a copper strike-plating was performed for 60 seconds under the following conditions.

| | |
|---|---|
| $Cu_2P_2O_7 \cdot 3H_2O$: | 30 g/l |
| $K_4P_2O_7$: | 300 g/l |
| pH: | 8 |
| current density: | 1.5 A/dm$^2$ |

Further, plating to be the thickness of 1 μm under the following conditions.

| | |
|---|---|
| $Cu_2P_2O_7 \cdot 3H_2O$: | 30 g/l |
| $K_4P_2O_7$: | 300 g/l |
| pH: | 8 |
| current density: | 4 A/dm$^2$ |

Afterward, the ultra-thin copper foil was electroplated to be the thickness of 3 μm under the following conditions.

| | |
|---|---|
| Cu concentration: | 50 g/l |
| $H_2SO_4$: | 100 g/l |
| current density: | 20 A/dm$^2$ |

Afterward, roughening which copper particles were deposited was performed. As rust-prevention and surface treatment, the roughened ultra-thin copper foil was plated by zinc and treated by chromate to obtain an ultra-thin copper foil with a carrier.

Example 7

1. Smoothing of Carrier Foil

A copper foil having Rz of 1.3 μm and the thickness of 33 μm was immersed in the solution containing sulfuric acid of 60 g/l with a temperature of 50° C. for 110 seconds and made the surface smooth by dissolving, then the smoothed surface copper foil having Rz of 1.1 μm was obtained. Then, this foil was made smooth to Rz of 0.5 μm by being made into a cathode, using the brightening copper plating bath which contains copper concentration of 60 g/l and sulfuric acid concentration of 100 g/l and add the small amount of additive, passing the current having the current density of 6 A/dm$^2$ for 1.2 minutes, and plating for fill concavities of the surface.

2. Formation of Peeling Layer

A peeling layer was formed by applying benzotriazole (organic coating) on the smoothed surface of the carrier copper foil.

3. Formation of Ultra-Thin Copper Foil

Next, on this organic coating, a copper strike-plating was performed for 60 seconds under the following conditions.

| | |
|---|---|
| $Cu_2P_2O_7 \cdot 3H_2O$: | 30 g/l |
| $K_4P_2O_7$: | 300 g/l |
| pH: | 8 |
| current density: | 1.5 A/dm$^2$ |

Then, the ultra-thin copper foil was electroplated to be the thickness of 3 μm under the following conditions.

| | |
|---|---|
| $Cu_2P_2O_7 \cdot 3H_2O$: | 85 g/l |
| $K_4P_2O_7$: | 350 g/l |
| $NH_4OH$ (28%): | 5 ml/l |
| pH: | 8.5 |
| current density: | 4 A/dm$^2$ |

Further, roughening which copper particles were deposited was performed. As rust-prevention and surface treatment, the roughened ultra-thin copper foil was plated by zinc and treated by chromate to obtain an ultra-thin copper foil with a carrier.

Example 8

1. Smoothing of Carrier Foil

After performing the mechanical polishing of the copper foil having Rz of 2.5 μm and the thickness of 55 μm and smoothing the mean surface roughness Rz to 1.3 μm, the foil was immersed in the solution containing nitric acid of 30 g/l with a temperature of 40° C. for 30 seconds and made the surface smooth by dissolving, then the smoothed surface copper foil having Rz of 1.1 μm was obtained. Then, this foil was made smooth to Rz of 0.6 μm by being made into a cathode, using the brightening copper plating bath which contains copper concentration of 30 g/l and sulfuric acid concentration of 100 g/l and add the small amount of additive, passing the current having the current density of 7 A/dm$^2$ for 1.0 minutes, and plating for fill concavities of the surface.

2. Formation of Peeling Layer

Electroplating of chromium-cobalt was continuously performed on the smoothed surface of a carrier copper foil being made smooth, and the plating layer of the deposited amount 2.0 mg/dm$^2$ was formed.

3. Formation of Ultra-Thin Copper Foil

Next, on this chromium-cobalt layer, an ultra-thin copper layer of the thickness of 3 μm was electroplated under the following conditions.

| | |
|---|---|
| $Cu_2P_2O_7 \cdot 3H_2O$: | 85 g/l |
| $K_4P_2O_7$: | 350 g/l |
| $NH_4OH$ (28%): | 5 ml/l |
| pH: | 8.5 |
| current density: | 6 A/dm$^2$ |

Further, roughening which copper particles were deposited was performed. As rust-prevention and surface treatment, the roughened ultra-thin copper foil was plated by zinc and treated by chromate to obtain an ultra-thin copper foil with a carrier.

Example 9

1. Smoothing of Carrier Foil

An electrodeposited copper foil having a surface roughness Rz of 1.9 μm and a thickness of 35 μm was made into an anode and in an electrolytic solution of the sulfuric concentration of 50 g/l, passing the current having the current density of 15 A/dm$^2$ for 10 seconds made the surface smooth by dissolving, and the smoothed surface having Rz of 1.2 μm was obtained. Then, this electrodeposited copper foil that have the smoothed surface was made into a cathode. And the copper foil (carrier copper foil) that made smooth to be Rz of 0.65 μm was obtained by using the bright nickel plating bath which contains nickel sulfate of 220 g/l and nickel chloride of 40 g/l and boric acid of 15 g/l and add the small amount of additive, passing the current having the current density of 3 A/dm$^2$ for 2.5 minutes, and plating for fill concavities of the surface.

2. Formation of Peeling Layer

Electroplating of chromium was continuously performed on the smoothed surface of the carrier copper foil being made smooth, and the chromium plating peeling layer of the amount of deposition of 0.50 mg/dm$^2$ was formed. In this surface layer the hydrated oxide film was formed.

3. Formation of Ultra-Thin Copper Foil

On this chromium plating layer, a copper strike-plating was performed for 60 seconds under the following conditions.

| | |
|---|---|
| $Cu_2P_2O_7 \cdot 3H_2O$: | 30 g/l |
| $K_4P_2O_7$: | 250 g/l |
| PH: | 8 |
| current density: | 1.5 A/dm$^2$ |

Then, the ultra-thin copper foil was electroplated to be the thickness of 3 μm under the following conditions.

| | |
|---|---|
| Cu concentration: | 30 g/l |
| $H_2SO_4$: | 100 g/l |
| current density: | 10 A/dm$^2$ |

Further, roughening which copper particles were deposited was performed. As rust-prevention and surface treatment, the roughened ultra-thin copper foil was plated by zinc and treated by chromate to obtain an ultra-thin copper foil with a carrier.

Example 10

1. Smoothing of Carrier Foil

The electrodeposited copper foil which is made by polishing a copper foil having Rz of 3.5 μm and the thickness of 55 μm mechanically was made into an anode, in the electrolytic solution of the pyrophosphoric acid of concentration of 80 g/l, passing the current having the current density of 20 A/dm$^2$ for 60 seconds made the surface smooth by dissolving, and the smoothed surface of Rz of 0.85 μm was obtained. Next, using a brightening copper plating bath which contained copper concentration of 50 g/l, sulfuric acid concentration of 90 g/l and added the small amount of additive, passing the current having the current density of 3 A/dm$^2$ for 1 minutes, the foil was plated for filling surface concavities to obtain a carrier foil of Rz of 0.45 μm.

2. Formation of Peeling Layer

Electroplating of nickel-chromium was continuously performed on this smoothed surface of a carrier copper foil being made smooth, and nickel-chromium plating layer of the deposited amount of 1.50 mg/dm² was formed.

3. Formation of Ultra-Thin Copper Foil

On this nickel-chromium layer, a copper strike-plating was performed for 60 seconds under the following conditions.

| | |
|---|---|
| $Cu_2P_2O_7 \cdot 3H_2O$: | 30 g/l |
| $K_4P_2O_7$: | 300 g/l |
| pH: | 8 |
| current density: | 1.5 A/dm² |

Then, the ultra-thin copper foil was electroplated to be the thickness of 3 μm under the following conditions.

| | |
|---|---|
| Cu concentration: | 50 g/l |
| $H_2S_4$: | 100 g/l |
| current density: | 20 A/dm² |

At the last, roughening which copper particles were deposited was performed. As rust-prevention and surface treatment, the roughened ultra-thin copper foil was plated by zinc and treated by chromate to obtain an ultra-thin copper foil with a carrier.

Comparative Example 1

1. Carrier Foil

A copper foil having the surface roughness of Rz of 3.2 μm is made as a carrier foil.

2. Formation of Peeling Layer

Electroplating of chromium was continuously performed on the above-mentioned carrier copper, and the chromium plating peeling layer with the amount of deposition of 1.5 mg/dm² was formed. The hydrated oxide in this surface layer film was formed.

3. Formation of Ultra-Thin Copper Foil

On this chromium plating peeling layer, a copper strike-plating was performed for 60 seconds under the following conditions.

| | |
|---|---|
| $Cu_2P_2O_7 \cdot 3H_2O$: | 30 g/l |
| $K_4P_2O_7$: | 300 g/l |
| pH: | 8 |
| current density: | 1.5 A/dm² |

Further, plating with the thickness of 1 μm under the following conditions.

| | |
|---|---|
| $Cu_2P_2O_7 \cdot 3H_2O$: | 30 g/l |
| $K_4P_2O_7$: | 300 g/l |
| pH: | 8 |
| current density: | 4 A/dm² |

Afterward, the ultra-thin copper foil was electroplated to be thickness of 3 μm under the following conditions.

| | |
|---|---|
| Cu concentration: | 50 g/l |
| $H_2S_4$: | 100 g/l |
| current density: | 20 A/dm² |

Further, roughening which copper particles were deposited was performed. As rust-prevention and surface treatment, the roughened ultra-thin copper foil was plated by zinc and treated by chromate to obtain an ultra-thin copper foil with a carrier.

Preparation of the Sample for Evaluation of Pinholes and Confirmation of Visibility The samples for evaluation of pinholes and carrier peel strength of the foils shown in the above examples and comparative example 1 were prepared and evaluated as follows.

(1) Preparation of One-Sided Copper Cladding Laminate Board for Measurement of Pinholes and Carrier Peel Strength The ultra-thin copper foil with a carrier foil (examples 1 to 10 and comparative example 1) was cut to "250 mm×250 mm", then the surface of ultra-thin copper foil side was placed on the sheet of the number of a glass fiber reinforced epoxy prepreg sheets (FR-4) having a thickness after hot-bonding of 1 mm, the assembly was sandwiched between two flat stainless steel plates, then the assembly was hot-bonded at a temperature of 170° C. and a pressure of 50 kg/cm² for 60 minutes to produce a one-sided copper-cladding FR-4 laminate board with a carrier foil.

(2) Preparation of the Film for Confirmation of Visibility

The ultra-thin copper foil with a carrier copper foil (examples 1 to 10 and comparative example 1) was cut to "250 mm×250 mm", then the surface of roughened surface side was placed on a polyimide sheet of a thickness of 50 μm (UPILEX-VT made by Ube Industry), the assembly was sandwiched between two flat stainless steel plates, then the assembly was hot-bonded at a temperature of 330° C. and a pressure of 2 kg/cm² for 10 minutes by a 20 torr vacuum press, then was hot-bonded at a temperature of 330° C. and a pressure of 50 kg/cm² for 5 minutes to produce a one-sided copper-cladding polyimide laminate board with a carrier foil for the test of carrier peel strength. And the production was peeled off to prepare the sample for confirmation of visibility.

Evaluation of Properties of Films (1) Measurement of Pinholes

After peeling off the carrier copper foil from a "250 mm×250 mm" one-sided copper-cladding laminate board prepared by the method of the above (1), it was illuminated with light from the resin board side in a dark room and the number of pinholes was counted by the light passing through it. The results of evaluation are shown in Table 1.

(2) Measurement of Carrier Peel Strength

A sample is cut out from an one-sided copper-cladding laminate board with a carrier copper foil prepared by the method of the above (1), the carrier copper foil is peeled off from the electroplated ultra-thin copper foil by the measurement sample width of 10 mm and the peel strength was measured by an n of 3 in accordance with the method defined in JIS C 6511. The results of evaluation are shown in Table 1.

(3) Confirmation of Visibility

The transmittance is measured by look at the rear surface from a film, which is peeled off a carrier copper foil and dissolved a thin copper foil, and the results were shown in percent in Table 1. In addition, the transmittance is such a result of high transparent that percent is large.

TABLE 1

|  | roughness of carrier foil (μm) | carrier peel strength (KN/m) | pinholes (number) | transmittance (%) |
|---|---|---|---|---|
| Example 1 | 0.65 | 0.023 | 3 | 75 |
| Example 2 | 0.55 | 0.031 | 2 | 85 |
| Example 3 | 1.20 | 0.035 | 4 | 70 |
| Example 4 | 1.00 | 0.021 | 5 | 70 |
| Example 5 | 0.50 | 0.031 | 0 | 90 |
| Example 6 | 0.45 | 0.027 | 1 | 95 |
| Example 7 | 0.50 | 0.022 | 3 | 85 |
| Example 8 | 0.60 | 0.034 | 2 | 80 |
| Example 9 | 0.65 | 0.026 | 2 | 75 |
| Example 10 | 0.45 | 0.027 | 0 | 95 |
| Comparative Example 1 | 3.2 | 0.035 | 16 | 0 |

Evaluation Result (1) Pinholes

The comparative example 1 had numerous pinholes, while the samples of the examples were confirmed to have less pinhole and to have no troubles in practical use.

(2) Carrier Peel Strength

It was confirmed that the carrier peel strength shows a less or equivalent value to the comparative example 1.

(3) Visibility (Transmittance)

Since a smoothing process was not performed to a carrier foil in the comparative example 1, the surface roughness of a carrier foil was transferred to the film and the transmittance was very bad. By making the surface roughness of a carrier foil smooth, the transmittance showed more than 70%, and visibility is so high that it is enough to use actually.

In the above examples of this invention, an electrodeposited copper foil was used as a carrier foil, but similar effects are obtained even if using an electrodeposited copper alloy foil, a rolled copper (alloy) foil as a carrier foil.

Moreover, the ultra-thin copper foil was formed in a copper sulfate plating bath, a copper pyrophosphate plating bath, a copper cyanide plating bath, but it may also be formed, although omitted for details, in a cupric fluoborate plating bath.

With the method of producing an ultra-thin copper foil with a carrier in this invention, it can be produced that has few pinholes and good visibility by making the surface of a carrier foil smooth. Moreover, the plating on the peeling layer has been considered being difficult to plate uniformly due to its peelability, but uniform copper plating is possible by using strike-plating and therefore an ultra-thin copper foil with a carrier with few pinholes can be produced.

Further although the number of pinholes and visibility of an ultra-thin copper foil were conventionally depending on the roughness of the carrier foil of a copper foil with a carrier foil, this invention can produce a copper foil with a carrier having few pinholes and good visibility by making the surface of carrier foil smooth. Moreover, also in producing cost, it can produce at the price without changing mostly from the former.

What claimed is:

1. An ultra-thin copper foil comprising:
   a copper carrier foil having at least one surface with a beginning mean surface roughness Rz in a range of 0.01 to 10 μm and then electrochemically-polished to a final mean surface roughness Rz of 0.01 to 2.0 μm;
   a peeling layer stacked on the electrochemically-polished surface of the copper carrier foil; and
   an ultra-thin copper foil layer stacked on the peeling layer, wherein the peeling layer is directly formed on the copper carrier foil and the ultra-thin copper foil layer is directly formed on the peeling layer.

2. The ultra-thin copper foil as set forth in claim 1, wherein the peeling layer contains at least one of chromium, nickel, cobalt, iron, molybdenum, titanium, tungsten, phosphorus and/or layers of alloys thereof or layers of hydrated oxides thereof.

3. A printed circuit board wherein a high density ultra-fine circuit is formed by using the ultra-thin copper foil as set forth in claim 2.

4. A multilayer printed circuit board wherein a high density ultra-fine circuit is formed by using the ultra-thin copper foil as set forth in claim 2.

5. A chip on film circuit board wherein a high density ultra-fine circuit is formed by using the ultra-thin copper foil as set forth in claim 2.

6. The ultra-thin copper foil as set forth in claim 1, wherein the peeling layer is an organic coating layer.

7. A printed circuit board wherein a high density ultra-fine circuit is formed by using the ultra-thin copper foil as set forth in claim 6.

8. A multilayer printed circuit board wherein a high density ultra-fine circuit is formed by using the ultra-thin copper foil as set forth in claim 6.

9. A chip on film circuit board wherein a high density ultra-fine circuit is formed by using the ultra-thin copper foil as set forth in claim 6.

10. A printed circuit board wherein a high density ultra-fine circuit is formed by using the ultra-thin copper foil as set forth in claim 1.

11. A multilayer printed circuit board wherein a high density ultra-fine circuit is formed by using the ultra-thin copper foil as set forth in claim 1.

12. A chip on film circuit board wherein a high density ultra-fine circuit is formed by using the ultra-thin copper foil as set forth in claim 1.

13. An ultra-thin copper foil comprising:
    a copper carrier foil having at least one surface with a mechanically-polished beginning mean surface roughness Rz in a range of 0.01 to 10 μm and then electrochemically-polished to a final mean surface roughness Rz of 0.01 to 2.0 μm;
    a peeling layer stacked on the electrochemically-polished surface of the copper carrier foil; and
    an ultra-thin copper foil layer stacked on the peeling layer, wherein the peeling layer is directly formed on the copper carrier foil and the ultra-thin copper foil layer is directly formed on the peeling layer.

14. An ultra-thin copper foil comprising:
    a copper carrier foil having at least one surface with a beginning mean surface roughness Rz in a range of 0.01 to 10 μm and then chemically-polished to a final mean surface roughness Rz of 0.01 to 2.0 μm;
    a peeling layer stacked on the chemically-polished surface of the copper carrier foil; and
    an ultra-thin copper foil layer stacked on the peeling layer, wherein the peeling layer is directly formed on the copper carrier foil and the ultra-thin copper foil layer is directly formed on the peeling layer.

15. An ultra-thin copper foil comprising:
    a copper carrier foil having at least one surface with a mechanically-polished beginning mean surface roughness Rz in a range of 0.01 to 10 µm and then chemically-polished to a final mean surface roughness Rz of 0.01 to 2.0 µm;
a peeling layer stacked on the chemically-polished surface of the copper carrier foil; and
an ultra-thin copper foil layer stacked on the peeling layer
wherein the peeling layer is directly formed on the copper carrier foil and the ultra-thin copper foil layer is directly formed on the peeling layer.

16. An ultra-thin copper foil comprising:
a copper carrier foil having at least one surface with a beginning mean surface roughness Rz in a range of 0.01 to 10 µm and then copper-plated or nickel-plated to a final mean surface roughness Rz of 0.01 to 2.0 µm;
a peeling layer stacked on the copper-plated or nickel-plated surface of the copper carrier foil; and
an ultra-thin copper foil layer stacked on the peeling layer, wherein the peeling layer is directly formed on the copper-plated or nickel-plated surface of the copper carrier foil and the ultra-thin copper foil layer is directly formed on the peeling layer.

17. An ultra-thin copper foil comprising:
a copper carrier foil having at least one surface with a mechanically-polished beginning mean surface roughness Rz in a range of 0.01 to 10 µm and then copper-plated or nickel-plated to a final mean surface roughness Rz of 0.01 to 2.0 µm;
a peeling layer stacked on the copper-plated or nickel-plated surface of the copper carrier foil; and
an ultra-thin copper foil layer stacked on the peeling layer, wherein the peeling layer is directly formed on the copper-plated or nickel-plated surface of the copper carrier foil and the ultra-thin copper foil layer is directly formed on the peeling layer.

18. An ultra-thin copper foil comprising:
a copper carrier foil having at least one surface with a chemically-polished beginning mean surface roughness Rz in a range of 0.01 to 10 µm and then copper-plated or nickel-plated to a final mean surface roughness Rz of 0.01 to 2.0 µm;
a peeling layer stacked on the copper-plated or nickel-plated surface of the copper carrier foil; and
an ultra-thin copper foil layer stacked on the peeling layer, wherein the peeling layer is directly formed on the copper-plated or nickel-plated surface of the copper carrier foil and the ultra-thin copper foil layer is directly formed on the peeling layer.

19. An ultra-thin copper foil comprising:
a copper carrier foil having at least one surface with a mechanically-polished and then chemically-polished beginning mean surface roughness Rz in a range of 0.01 to 10 µm and then copper-plated or nickel-plated to a final mean surface roughness Rz of 0.01 to 2.0 µm;
a peeling layer stacked on the copper-plated or nickel-plated surface of the copper carrier foil; and
an ultra-thin copper foil layer stacked on the peeling layer, wherein the peeling layer is directly formed on the copper-plated or nickel-plated surface of the copper carrier foil and the ultra-thin copper foil layer is directly formed on the peeling layer.

20. An ultra-thin copper foil with a carrier comprising:
a copper carrier foil having at least one surface with an electrochemically-polished beginning mean surface roughness Rz in a range of 0.01 to 10 µm and then copper-plated or nickel-plated to a final mean surface roughness Rz of 0.01 to 2.0 µm;
a peeling layer stacked on the copper-plated or nickel-plated surface of the copper carrier foil; and
an ultra-thin copper foil layer stacked on the peeling layer, wherein the peeling layer is directly formed on the copper-plated or nickel-plated surface of the copper carrier foil and the ultra-thin copper foil layer is directly formed on the peeling layer.

21. An ultra-thin copper foil with a carrier comprising:
a copper carrier foil having at least one surface with a mechanically-polished and then electrochemically-polished beginning mean surface roughness Rz in a range of 0.01 to 10 µm and then copper-plated or nickel-plated to a final mean surface roughness Rz of 0.01 to 2.0 µm;
a peeling layer stacked on the copper-plated or nickel-plated surface of the copper carrier foil; and
an ultra-thin copper foil layer stacked on the peeling layer, wherein the peeling layer is directly formed on the copper-plated or nickel-plated surface of the copper carrier foil and the ultra-thin copper foil layer is directly formed on the peeling layer.

* * * * *